United States Patent
Iwase

(10) Patent No.: US 12,207,536 B2
(45) Date of Patent: Jan. 21, 2025

(54) FILM FORMING METHOD FOR ORGANIC SEMICONDUCTOR FILM

(71) Applicant: FUJIFILM Corporation, Tokyo (JP)

(72) Inventor: Eijiro Iwase, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 669 days.

(21) Appl. No.: 17/387,111

(22) Filed: Jul. 28, 2021

(65) Prior Publication Data
US 2021/0359212 A1 Nov. 18, 2021

Related U.S. Application Data

(63) Continuation of application No. PCT/JP2020/001237, filed on Jan. 16, 2020.

(30) Foreign Application Priority Data

Feb. 4, 2019 (JP) .................................. 2019-017672

(51) Int. Cl.
*H10K 71/40* (2023.01)
*H10K 71/15* (2023.01)
*H10K 10/46* (2023.01)

(52) U.S. Cl.
CPC ............. *H10K 71/40* (2023.02); *H10K 71/15* (2023.02); *H10K 10/462* (2023.02)

(58) Field of Classification Search
None
See application file for complete search history.

(56) References Cited

U.S. PATENT DOCUMENTS

| | | | |
|---|---|---|---|
| 6,211,043 B1 * | 4/2001 | Nishio | C23C 16/18 438/488 |
| 2002/0197393 A1 * | 12/2002 | Kuwabara | H10K 50/805 427/66 |

(Continued)

FOREIGN PATENT DOCUMENTS

| | | |
|---|---|---|
| JP | 2003-77661 A | 3/2003 |
| JP | 2004-230209 A | 8/2004 |

(Continued)

OTHER PUBLICATIONS

International Preliminary Report on Patentability and Written Opinion of the International Searching Authority (PCT/IB/326, PCT/IB/373, and PCT/ISA/237) for International Application No. PCT/JP2020/001237, dated Aug. 19, 2021, with English translation of the Written Opinion.

(Continued)

*Primary Examiner* — Michelle Mandala
(74) *Attorney, Agent, or Firm* — Birch, Stewart, Kolasch & Birch, LLP

(57) ABSTRACT

An object of the present invention is to provide a film forming method for an organic semiconductor film, with which an organic semiconductor film having good uniformity and high mobility can be manufactured with good productivity. A coating liquid is prepared by dissolving an organic semiconductor material in a solvent, the coating liquid is sprayed by a spray unit, and the coating liquid is applied onto a temperature-controlled substrate while the coating liquid during the flight which has been sprayed by the spray unit is being heated, whereby problems are solved.

12 Claims, 3 Drawing Sheets

(56) References Cited

U.S. PATENT DOCUMENTS

| | | | |
|---|---|---|---|
| 2008/0118629 A1 | 5/2008 | Shimoda et al. | |
| 2009/0074974 A1 | 3/2009 | Yokoi et al. | |
| 2011/0236675 A1* | 9/2011 | Oki | H10K 71/12 |
| | | | 257/E21.09 |
| 2012/0248425 A1* | 10/2012 | Yang | H10K 10/474 |
| | | | 427/256 |
| 2014/0061486 A1* | 3/2014 | Bao | G01J 3/28 |
| | | | 29/25.01 |
| 2015/0263286 A1* | 9/2015 | Lee | H10K 71/00 |
| | | | 438/46 |

FOREIGN PATENT DOCUMENTS

| | | |
|---|---|---|
| JP | 2008-91316 A | 4/2008 |
| JP | 2009-90637 A | 4/2009 |
| JP | 2015-185620 A | 10/2015 |
| WO | WO 2009/028453 A1 | 3/2009 |

OTHER PUBLICATIONS

International Search Report (PCT/ISA/210) for International Application No. PCT/JP2020/001237, dated Apr. 7, 2020, with English translation.

Japanese Office Action for corresponding Japanese Application No. 2020-571062, dated Sep. 13, 2022, with English translation.

* cited by examiner

FILM FORMING METHOD FOR ORGANIC SEMICONDUCTOR FILM

CROSS-REFERENCE TO RELATED APPLICATIONS

This application is a Continuation of PCT International Application No. PCT/JP2020/001237 filed on Jan. 16, 2020, which claims priority under 35 U.S.C. § 119(a) to Japanese Patent Application No. 2019-017672 filed on Feb. 4, 2019. The above application is hereby expressly incorporated by reference, in its entirety, into the present application.

BACKGROUND OF THE INVENTION

1. Field of the Invention

The present invention relates to a film forming method for an organic semiconductor film that is used for an organic thin film transistor or the like.

2. Description of the Related Art

Unlike a conventional inorganic semiconductor, an organic semiconductor is made of an organic molecule that can be dissolved in various solvents, and thus a thin film can be formed by a technique such as coating or printing. As a result, an organic semiconductor material can be used for various devices that are manufactured by a consecutive manufacturing process such as a roll-to-roll process.

Correspondingly, various organic thin film transistors using such organic semiconductors have been proposed.

In the following description, roll-to-roll is also referred to as "RtoR".

The organic semiconductor film preferably has high mobility in terms of the switching speed of the organic thin film transistor and the like. However, in general, an organic semiconductor material has a property that the higher mobility the material exhibits, the lower the solubility of the material is in a solvent.

In addition, in the organic semiconductor film, the higher the crystallinity (the single crystallinity) is, the higher mobility can be obtained. Further, in the organic semiconductor film, the higher the uniformity is, the higher mobility can be obtained.

However, an organic semiconductor material has a low solubility in a solvent. As a result, in a case where an organic semiconductor material is dissolved in a solvent to prepare a coating liquid, and then the coating liquid is applied, it is difficult to control drying and is difficult to form an organic semiconductor film having high crystallinity, high uniformity, and the like. Further, the low solubility of the organic semiconductor material leads to the problem that the productivity of the organic semiconductor film using a coating liquid is low.

On the other hand, it has been exemplified in the existing invention that the crystallinity of the organic semiconductor material and the film uniformity can be improved by matching the growth speed of crystals with the drying speed of the coating liquid.

For example, JP2015-185620A discloses a film forming method for an organic semiconductor film, including a step 1 of dissolving an organic semiconductor in 3-chlorothiophene to prepare a coating liquid, a step 2 of preparing a substrate on which a contact member having an end surface that stands up with respect to a surface of the substrate is placed, a step 3 of supplying the prepared coating liquid to the substrate to form liquid droplet that comes into contact with the end surface of the contact member and a surface of the substrate at the same time, and a step 4 of evaporating 3-chlorothiophene from the liquid droplets that come into contact with the end surface of the contact member and the surface of the substrate at the same time.

SUMMARY OF THE INVENTION

In the film forming method for an organic semiconductor film disclosed in JP2015-185620A, the liquid droplet that comes into contact with the end surface of the contact member and the surface of the substrate are dried from the edge part on the side opposite to the contact member toward the contact member. In this film forming method for an organic semiconductor film, the liquid droplet is gradually dried from the edge part toward the contact member to match the growth speed of the crystal with the drying speed of the coating liquid, which enables the film formation of an organic semiconductor film having high crystallinity and high uniformity.

However, in the film forming method disclosed in JP2015-185620A, since the film formation is gradually carried out by drying liquid droplets from the edge part of the liquid droplets, the film forming speed is slow, and the productivity is low. Further, it is necessary to stand a contact member on the substrate, and thus it is difficult to apply the above method to a highly productive film forming method in which a substrate and a supply unit of a coating liquid are relatively moved to consecutively form a film as in a case of RtoR.

An object of the present invention is to solve such problems of the related art and to provide a film forming method for an organic semiconductor film, with which an organic semiconductor film having good uniformity and the like and having high mobility can be manufactured with good productivity.

For solving the above problems, the present invention has the following configurations.

[1] A film forming method for an organic semiconductor film, comprising dissolving an organic semiconductor material in a solvent to prepare a coating liquid,
spraying the coating liquid with a spray unit, and
coating a temperature-controlled substrate with the coating liquid while heating the coating liquid during flight, which has been sprayed with the spray unit.

[2] The film forming method for an organic semiconductor film according to [1], in which the spray unit is an ultrasonic spray.

[3] The film forming method for an organic semiconductor film according to [2], in which a surface roughness Ra of a distal end surface of a nozzle of the ultrasonic spray is 1 to 100 μm.

[4] The film forming method for an organic semiconductor film according to [2] or [3], in which the ultrasonic spray has a tapered protruding part on a peripheral part of a distal end surface of a nozzle.

[5] The film forming method for an organic semiconductor film according to any one of [1] to [4], in which the coating liquid is prepared by heating.

[6] The film forming method for an organic semiconductor film according to any one of [1] to [5], in which the heated coating liquid is supplied to the spray unit.

[7] The film forming method for an organic semiconductor film according to any one of [1] to [6], in which the coating liquid is heated in a supply unit for supplying the coating liquid to the spray unit.

[8] The film forming method for an organic semiconductor film according to any one of [1] to [7], in which spraying is carried out while the coating liquid is heated in the spray unit.

[9] The film forming method for an organic semiconductor film according to any one of [1] to [8], in which the coating liquid during flight is heated with an infrared heater.

[10] The film forming method for an organic semiconductor film according to any one of [1] to [9], in which the coating liquid during the flight is heated with a temperature-controlled cylinder that surrounds at least a part of a flight space of the coating liquid.

[11] The film forming method for an organic semiconductor film according to any one of [1] to [10], in which the coating liquid during the flight is heated with a temperature-controlled gas which flows on an outer side of a flight space of the coating liquid in a flight direction of the coating liquid.

[12] The film forming method for an organic semiconductor film according to any one of [1] to [11], in which the substrate is coated with the coating liquid while a flight space of the coating liquid is regulated with a gas that flows in a flight direction of the coating liquid.

[13] The film forming method for an organic semiconductor film according to any one of [1] to [12], in which a temperature of the substrate is controlled within ±10° C. of a temperature of the coating liquid that is supplied to a supply unit for supplying the coating liquid to the spray unit.

According to the present invention, it is possible to form an organic semiconductor film having good uniformity and the like and high mobility with good productivity.

DESCRIPTION OF THE PREFERRED EMBODIMENTS

Hereinafter, a film forming method for an organic semiconductor film according to the embodiment of the invention will be described in detail based on suitable examples illustrated in the attached drawings.

A numerical value range represented using "to" in the present invention means a range including the numerical values described before and after "to" as the lower limit and the upper limit respectively.

Figure 1:
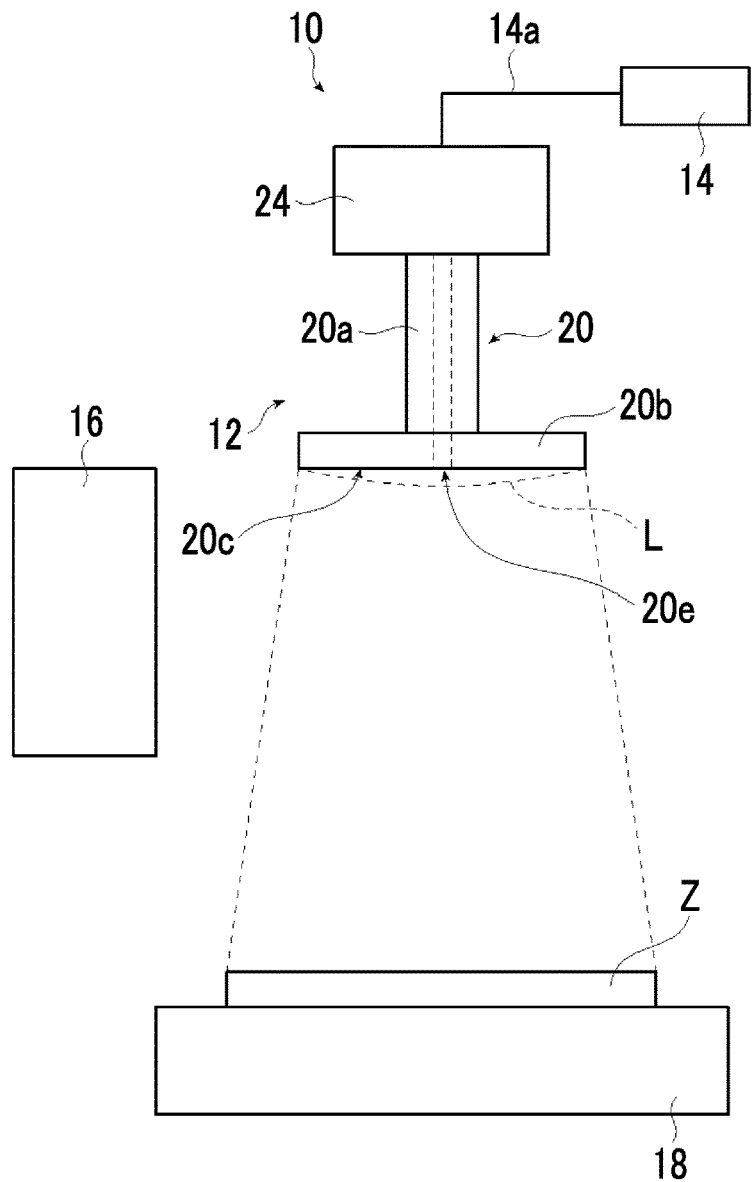
FIG. 1 is a diagram conceptually illustrating an example of a film forming device for carrying out a film forming method for an organic semiconductor film according to the embodiment of the invention.

FIG. 1 illustrates an example of a film forming device for an organic semiconductor film, for carrying out an example of a film forming method for an organic semiconductor film according to the embodiment of the invention. In the following description, the film forming method for an organic semiconductor film according to the embodiment of the invention is also simply referred to as the "film forming method according to the embodiment of the invention".

A film forming device 10 illustrated in FIG. 1 is a device forming an organic semiconductor film on a substrate Z and has an ultrasonic spray 12, a supply unit 14, a heating unit 16, and a substrate holder 18.

In the film forming method according to the embodiment of the invention, the substrate Z on which an organic semiconductor film is formed is not limited, and all known ones on which an organic semiconductor film is formed can be used.

Examples of the substrate Z include a resin film such as a polyethylene terephthalate (PET) film or a polyethylene naphthalate (PEN) film, a glass plate, and a silicon wafer.

Further, the substrate Z may be a work-in-process product in which some kind of member is formed, such as a work-in-process product (a semi-manufactured product) matching with a bottom-gate and bottom-contact type organic thin film transistor in which a gate electrode, a gate insulating film, a source electrode, and a drain electrode are formed on the base material, a work-in-process product matching with a bottom-gate and top-contact type organic thin film transistor in which a gate electrode and a gate insulating film is formed on the base material, a work-in-process product matching with a top-gate and bottom-contact type organic thin film transistor in which a source electrode and a drain electrode are formed on the base material, or a work-in-process product matching with a solar cell in which a lower electrode or the like is formed on the insulative base material or the base material having an insulating layer.

In this case, examples of the base material of the work-in-process product include various materials which have been exemplified above as the substrate Z, such as a resin film, a glass plate, and a silicon wafer.

The substrate Z is preferably subjected to a water repellency treatment and/or a self-aggregating property type dispersion treatment. This makes it possible to suitably control the arrangement of the organic semiconductor material coated on the substrate Z to form an organic semiconductor film having high crystallinity and/or high uniformity. Examples of the self-aggregating property type dispersion treatment include the formation of a self-assembled monolayer film (a SAM film).

The water repellency treatment and/or the self-aggregating property type dispersion treatment may be carried out by a known method depending on the kinds of the substrate Z and the treatment liquid.

These treatments may be applied to at least the film forming part of the organic semiconductor film, such as the surface of the gate insulating layer.

The ultrasonic spray 12 is a spray unit in the film forming method according to the embodiment of the invention, which sprays a coating liquid L onto the substrate Z. The coating liquid L is a liquid that forms an organic semiconductor film and is obtained by dissolving an organic semiconductor material in a solvent. In the following description, the coating liquid L obtained by dissolving an organic semiconductor material in a solvent is also simply referred to as the "coating liquid L".

In the present invention, the spray unit is not limited to the ultrasonic spray 12. That is, in the present invention, various known liquid spray units (atomizers) can be used as the spray unit as long as they can spray a required amount of liquid droplets of a desired size in a mist shape depending on the organic semiconductor film to be formed, the state of the coating liquid L such as the concentration, the kind of the substrate Z, and the like. In the film forming method according to the embodiment of the invention, the liquid spray unit also includes those that are generally called a droplet hitting unit for a liquid and the like.

Examples of the spray unit include, in addition to the ultrasonic spray 12 in the example illustrated in the drawing, a two-fluid spray, an electric field spray (an electrospray), an electrostatic spray, and an inkjet head.

Among them, the ultrasonic spray 12 is suitably used in terms of the size of the liquid droplet to be sprayed, the uniformity of the liquid droplet size, and the uniformity of the liquid droplet density in the plane direction. These points will be described in detail later.

In the example illustrated in the drawing, the ultrasonic spray 12 has an ultrasonic spray nozzle 20 and a main body 24.

The ultrasonic spray nozzle 20 has a configuration in which a disk-shaped, that is, a thin cylindrical spray part 20b is provided at the distal end of a cylindrical flow path 20a. In the ultrasonic spray nozzle 20, the spray part 20b of the ultrasonic spray nozzle 20, in which a distal end surface 20c of the spray part 20b, that is, the distal end surface 20c of the ultrasonic spray nozzle 20, where the distal end surface 20c is the lower end part in the drawing, is the spray surface of the coating liquid L, is formed of, for example, various metals and carbon.

The main body 24 of the ultrasonic spray 12 has a built-in ultrasonic vibrator (a built-in ultrasonic oscillator) that ultrasonically vibrates the ultrasonic spray nozzle 20. Further, inside the main body 24 of the ultrasonic spray 12, a flow path for supplying the coating liquid L supplied from the supply unit 14 to the flow path 20a of the ultrasonic spray nozzle 20 is provided.

In the film forming method according to the embodiment of the invention, the ultrasonic spray 12 is not limited. That is, in the ultrasonic spray 12, various known ultrasonic sprays (ultrasonic atomizers) in which the coating liquid L that has wettably spread on the distal end surface 20c, which is the spray surface, is sprayed in a mist shape by ultrasonically vibrating the ultrasonic spray nozzle 20 can be used.

The distal end surface of the ultrasonic spray nozzle, which is the spray surface of the coating liquid L, is also called the "atomized surface".

Further, as the ultrasonic spray 12 and the ultrasonic spray nozzle 20, a commercially available product can also be suitably used. For example, examples of the ultrasonic spray 12 include Flexi-Coat, Exacta-Coat, and Medi-coat, which are manufactured by Sono-Tek Corporation, and an ultrasonic spray device manufactured by TIC Corporation. Examples of the ultrasonic spray nozzle include an AccuMist nozzle, a MicroMist nozzle, an Impact nozzle, a Vortex nozzle, and a Propel nozzle, which are manufactured by Sono-Tek Corporation. The ultrasonic spray nozzle may be appropriately selected depending on the width of the coating liquid with which coating is carried out, and the like.

In the film forming method according to the embodiment of the invention, the surface properties of the distal end surface 20c of the ultrasonic spray nozzle 20 are not limited and may be the same as those of the known ultrasonic spray nozzle. Here, the distal end surface 20c of the ultrasonic spray nozzle 20 preferably has a surface roughness Ra of 1 to 100 μm.

For uniformly applying the coating liquid L in the plane direction of the substrate Z with the ultrasonic spray 12, it is preferable that the coating liquid L supplied to the distal end surface 20c of the ultrasonic spray nozzle 20 wettably spreads quickly and uniformly on the distal end surface 20c.

In general, the surface tension of a coating liquid L forming an organic semiconductor film is about 20 to 30 mN/m. For this reason, in a case where the surface roughness Ra of the distal end surface 20c of the ultrasonic spray nozzle 20 is set to 1 to 100 μm, the coating liquid L supplied to the distal end surface 20c of the ultrasonic spray nozzle 20 can wettably spread quickly and uniformly on the entire surface of the distal end surface 20c by the capillary phenomenon. The surface roughness Ra of the distal end surface of the ultrasonic spray nozzle 20 is more preferably 5 to 50 μm.

The surface roughness Ra is an arithmetic mean roughness Ra and may be measured in accordance with JIS B 0601 (2001).

In the film forming method according to the embodiment of the invention, the shape of the distal end surface 20c of the ultrasonic spray nozzle 20 in the plane direction is also not limited and may be the same as those of the known ultrasonic spray nozzle. Accordingly, the distal end surface 20c may have a planar shape, a protruded shape, or a recessed shape, or may have a shape in which a plane or curved surface has a protruding part and/or a recessed part.

The ultrasonic spray nozzle 20 has a hole part 20e that opens in the distal end surface 20c so that the coating liquid is supplied to a liquid pool on the distal end surface 20c, which will be described later. The shape of the opening of the hole part 20e is not limited and may be circular, elliptical, or polygonal.

The distal end surface 20c of the ultrasonic spray nozzle 20 has a portion where the coating liquid L to be sprayed wettably spreads to form the liquid pool. In a case where the ultrasonic spray nozzle 20 is ultrasonically vibrated in a state in which a certain amount of liquid pool is present in this portion, liquid droplets having a size depending on the frequency are torn off and sprayed from the liquid pool.

Figure 2:
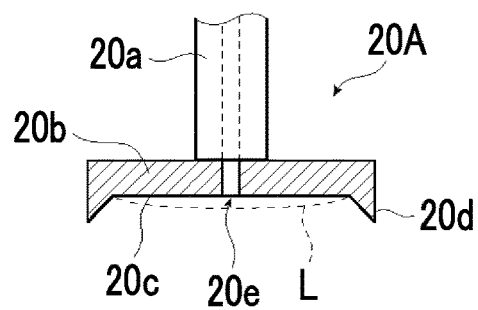
FIG. 2 is a diagram conceptually illustrating an example of an ultrasonic spray nozzle that is used in the film forming method for an organic semiconductor film according to the embodiment of the invention.

In the present invention, the ultrasonic spray nozzle preferably has a tapered protruding part 20d in the peripheral part, where the thickness of the protruding part 20d gradually decreases toward the spraying direction of the coating liquid L, as in the distal end surface 20c of the ultrasonic spray nozzle 20A illustrated in the cross-sectional diagram in FIG. 2.

As a result, the shape of the liquid in the liquid pool part can be made uniform. That is, in a case of a liquid having a low surface tension, the liquid may wettably spread, which may cause disadvantages such as difficulty in forming a liquid pool. On the contrary, in a case of a liquid having a high surface tension, the shape of the liquid droplet becomes spherical, which may cause, for example, the disadvantage that the ultrasonic wave is not uniformly applied in the plane. These problems are linked to the size distribution of the liquid droplets and the distribution of the flight distance and the directionality and causes the in-plane non-uniformity of the coating liquid L. On the other hand, in a case where the distal end surface 20c is surrounded by the tapered protruding part 20d, it is not easily affected by the physical properties of the coating liquid, and thus the shape of the liquid in the liquid pool part can be made uniform.

The shape of the protruding part 20d is not limited as long as the protruding part 20d has a wall shape that is formed over the entire peripheral part of the distal end surface 20c and a tapered shape in which the thickness gradually decreases toward the spraying direction of the coating liquid L. Preferred examples thereof include the protruding part 20d having a right-angled triangular cross section, which is perpendicular (substantially perpendicular) to the distal end surface 20*c* on the side of the periphery and is inclined in the outward direction of the inner side, as illustrated in FIG. 2.

The height of the protruding part 20*d* may be appropriately set depending on the amount of the coating liquid L sprayed by the ultrasonic spray 12, and the like.

The position of the protruding part 20*d* is not limited to the end part of the distal end surface 20*c* and may be inside the end part of the distal end surface 20*c*. That is, the forming position of the protruding part 20*d* is not limited in a case of being provided on the distal end surface 20*c* so that the hole part 20*e* for supplying the coating liquid to the liquid pool of the distal end surface 20*c* is surrounded.

In the ultrasonic spray nozzle 20 of the example illustrated in the drawing, the spray part 20*b* has a disk shape as described above. As a result, the shape of the distal end surface 20*c* of the ultrasonic spray nozzle 20 is circular.

In the film forming method according to the embodiment of the invention, the shape of the distal end surface of the ultrasonic spray nozzle is not limited to a circular shape, and various shapes such as an elliptical shape and a polygonal shape such as a triangle or a rectangle can be used. Generally, a distal end surface of an ultrasonic spray nozzle is circular.

The ultrasonic spray 12 preferably has a heating unit for heating the coating liquid L to be sprayed.

In the film forming method according to the embodiment of the invention, the coating liquid L preferably has a high concentration. Accordingly, it is preferable that the coating liquid L is prepared by heating a solvent to dissolve an organic semiconductor material, and it is preferable that the temperature is maintained even after the preparation and the coating liquid L is heated as necessary.

In a case where the ultrasonic spray 12 has a heating unit for the coating liquid L, the temperature of the coating liquid L can be maintained, the precipitation of the organic semiconductor material from the coating liquid L can be prevented, and thus it is possible to more stably carry out proper spraying of a coating liquid having a high concentration.

The heating unit for the coating liquid L in the ultrasonic spray 12 is not limited, and various known heating units such as various heaters, a circulation unit for a heating medium, and the like can be used. Further, in a case where the ultrasonic spray nozzle 20 is heated from the outside by a known heating unit such as an infrared heater or a ribbon heater, a heating unit for heating the coating liquid L can also be used.

The supply unit 14 supplies the coating liquid L obtained by dissolving an organic semiconductor material in a solvent to the ultrasonic spray 12 via the supply pipe 14*a*.

The coating liquid L supplied from the supply unit 14 to the ultrasonic spray 12 is supplied to the distal end surface 20*c* of the ultrasonic spray 12 via a path provided in the main body 24, a flow path 20*a*, and a spray part 20*b*, and wettably spreads on the distal end surface 20*c*.

The supply unit 14 is not limited, and various known pumps can be used as long as the target amount of the coating liquid L can be supplied to the ultrasonic spray 12. Examples thereof include a syringe pump, a tube pump, and a diaphragm pump.

For the same reason as that described in the ultrasonic spray 12 above, the supply unit 14 and the supply pipe 14*a* also preferably have a heating unit for the coating liquid L so that the temperature of the coating liquid L is maintained.

The heating unit of the supply unit 14 and the supply pipe 14*a* are not limited, and various known heating units that are the same as those of the ultrasonic spray 12 can be used.

The substrate holder 18 holds the substrate Z on which the organic semiconductor film is formed at the coating position of the coating liquid L.

The substrate holder 18 is not limited, and various substrate holders capable of holding the substrate Z at the coating position of the coating liquid L can be used depending on the kind of the substrate Z, the shape of the substrate Z, and the like. Accordingly, the substrate holder 18 may hold the substrate Z by being simply placed under the substrate Z. Alternatively, the substrate holder 18 may fixedly hold the substrate Z by the known means such as a method of using a jig, fitting, engagement, adhesion, or suction.

Further, in the consecutive film formation in which the substrate Z and the ultrasonic spray 12 are relatively moved, which will be described later, a transport unit for the substrate Z, such as an X axis stage, an X-Y axis stage, a belt conveyor, or a roller conveyor, may act as the substrate holder 18 in a case where the substrate Z is moved to consecutively form an organic semiconductor material into a film on a plurality of substrates Z.

Further, in a case of consecutively forming an organic semiconductor material into a film while transporting a long substrate Z in the longitudinal direction as in the case of RtoR, a transport unit for the substrate Z, such as a transport roller pair or a guide roller, may act as the substrate holder 18.

In the film forming device 10 for carrying out the film forming method according to the embodiment of the invention, the substrate holder 18 has a built-in temperature control unit for the substrate Z. The temperature control unit for the substrate Z by the substrate holder 18 is not limited, and various known temperature control units such as various heaters and a circulation unit for a heating medium can be used. Further, a heating unit such as a hot plate may be used as the substrate holder 18.

In the film forming method according to the embodiment of the invention, the temperature control of the substrate Z may not be operated by the substrate holder 18, and the temperature of the substrate Z held in the substrate holder 18 may be controlled using a known temperature control unit such as an infrared heater such as a halogen lamp, or a warm air supply unit.

The film forming device 10 has the heating unit 16.

The heating unit 16 heats the coating liquid L sprayed by the ultrasonic spray 12, between the ultrasonic spray 12 and the substrate holder 18. Specifically, the heating unit 16 heats the coating liquid L during the flight, that is, the liquid droplet of the coating liquid L during the flight, after being sprayed from the ultrasonic spray 12 and until being applied onto the substrate Z.

As will be described in detail later, in the film forming method according to the embodiment of the invention, an organic semiconductor film having uniformity and high mobility can be formed with good productivity by heating the coating liquid L during the flight, which has been sprayed by the ultrasonic spray 12.

The heating unit 16 is not limited to a heating unit that directly heats the coating liquid L. That is, the heating unit 16 may be a heating unit that heats the liquid droplet of the flying coating liquid L by heating the atmosphere of the flight space of the coating liquid L.

The heating unit 16 is not limited, and it is possible to use various heating units capable of heating the coating liquid L during the flight between the ultrasonic spray 12 and the substrate holder 18, where the influence of the heating units on the flight of the coating liquid L sprayed by the ultrasonic spray 12 is small.

Examples thereof include a halogen heater, a far-infrared heater, an infrared heater, a warm air heater, a ceramic heater, and a nichrome wire heater. Among them, a halogen heater, a far-infrared heater, an infrared heater, or the like, which utilizes light, radiant heat, or the like is suitably used in that the influence on the flight of the liquid droplet is small.

In the present invention, a plurality of heating units may be used in combination, including the heating unit 16a and the like described later, to heat the coating liquid L during the flight.

In the present invention, even in a case where the heating unit 16 heats only a part of the flight space of the coating liquid L, the effects of the present invention described later can be obtained. However, the heating unit 16 preferably heats the coating liquid in the range as wide as possible in the flight space of the coating liquid L.

Specifically, it is preferable to heat the coating liquid L in a region of 50% or more of the flight space of the coating liquid L, more preferable to heat the coating liquid L in a region of 75% or more, and still more preferable to heat the coating liquid L in a region close to the entire region.

Examples of the preferred heating unit include the heating unit 16*a* consisting of a tubular heating cylinder 30 and a temperature control unit 32 for controlling the temperature of the heating cylinder 30, as conceptually illustrated in FIG. 3.

The heating cylinder 30 is a tubular object formed a material and structure capable of conducting heat, such as a metal having high absorption of infrared rays, such as copper or stainless steel, a heat-resistant transparent material such as glass or quartz glass, or a material obtained by wrapping a metal around this transparent material.

The heating cylinder 30 is provided so that the flight space of the coating liquid L from the distal end surface 12*c* of the ultrasonic spray 12 to the substrate holder 18 is surrounded.

The temperature control unit 32 is a known temperature control unit such as a heater such as a halogen heater, a far-infrared heater, or an infrared heater, a hot air supply unit, a circulation unit for a temperature control medium, or a heater using a heating medium such as a heating wire, and heats the heating cylinder 30.

The heating unit 16*a* may have a configuration in which the heating cylinder 30 has the built-in temperature control unit 32.

That is, the heating cylinder 30 is a so-called hot wall (a radiant heat wall). Accordingly, the heating cylinder 30 heats the coating liquid L during the flight after being sprayed from the ultrasonic spray 12 and until being applied onto the substrate Z, by heating the atmosphere of the flight space of the coating liquid L.

According to the heating unit 16*a* using such a heating cylinder 30, it is possible to prevent the coating liquid L during the flight sprayed by the ultrasonic spray 12 from being affected by the airflow turbulence due to heating.

The shape of the heating cylinder 30 is not limited as long as is a tubular shape with which the heating cylinder 30 can surround at least a part of the flight space of the coating liquid L. Accordingly, regarding the heating cylinder 30, various tubular shapes such as a cylindrical shape, an elliptically cylindrical shape, and a rectangular cylindrical shape such as a square cylinder or a hexagonal cylinder can be used.

Further, the heating cylinder 30 may also serve as a regulating member that regulates the flight region of the coating liquid L, that is, the coating region of the coating liquid L.

The heating cylinder 30 may be provided so that at least a part of the flight space of the coating liquid L from the ultrasonic spray 12 to the substrate Z is surrounded.

The heating cylinder 30 preferably surrounds the flight space of the coating liquid at 50% or more of the flight distance with respect to the flight distance of the coating liquid L, where the flight distance is a distance from the distal end surface 20*c* of the ultrasonic spray 12 to the coating surface of the substrate Z, more preferably surrounds the flight space of the coating liquid L at 75% or more, and still more preferably surrounds the flight space of the coating liquid L in a region close to the entire region.

Other examples of the preferred heating unit include a heating unit 16*b* conceptually illustrated in FIG. 4.

The heating unit 16*b* has a supply pipe 36 and a gas supply unit which is not illustrated in the drawing.

The supply unit supplies the temperature-controlled gas to the supply pipe 36. The supply pipe 36 is a doublex pipe provided to surround the ultrasonic spray nozzle 20 and supplies the gas supplied from the gas supply unit, from the space between two pipes of the doublex pipe to the outside of the flight space of the coating liquid L.

That is, the heating unit 16*b* heats the coating liquid L and/or the atmosphere of the flight space of the coating liquid L by supplying the temperature-controlled airflow to the outside of the flight space of the coating liquid L. In this manner, the heating unit 16*b* heats the coating liquid L during the flight after being sprayed from the ultrasonic spray 12 and until being applied onto the substrate Z.

The gas supplied by the heating unit 16*b* is not limited, and various gases can be used as long as they do not affect the coating liquid L. Examples thereof include air and an inert gas such as nitrogen.

The flow rate and the flow quantity of the gas supplied by the heating unit 16*b* are also not limited, and the flow rate and the flow quantity with which the coating liquid L can be heated to the target temperature may be set depending on the temperature of the gas supplied by the heating unit 16*b*, and the like. However, it is necessary that the gas supplied by the heating unit 16*b* does not adversely affect the flight of the coating liquid L sprayed from the ultrasonic spray 12.

Further, the gas supplied by the heating unit 16*b* for heating the coating liquid L, that is, the temperature-controlled airflow supplied by the heating unit 16*b* may also serve as a regulating means for regulating the flight region of the coating liquid L, that is, the coating region of the coating liquid L. In other words, the gas supplied by the heating unit 16*b* for heating the coating liquid L may also serve as a so-called assist air that regulates the flight region of the liquid droplet in the ultrasonic spray.

In the film forming method according to the embodiment of the invention, a gas supply unit for only regulating the flight space of the coating liquid L, that is, the coating region of the coating liquid L may be used, where the gas supply unit does not heat the coating liquid L during the flight sprayed by the ultrasonic spray 12.

Hereinafter, the operation of the film forming device 10 illustrated in FIG. 1 will be described to describe the film forming method for an organic semiconductor film according to the embodiment of the invention in detail.

First, an organic semiconductor material is dissolved in a solvent to prepare the coating liquid L.

The organic semiconductor material that is formed into a film by the film forming method according to the embodiment of the invention is not limited, and various known materials that are formed into an organic semiconductor film formed by a so-called wet-type process (a wet process) such as a coating method can be used.

Examples thereof include a pentacene derivative such as 6,13-bis(triisopropylsilylethynyl)pentacene (TIPS pentacene), an anthradithiophene derivative such as 5,11-bis(triethylsilylethynyl)anthradithiophene (TES-ADT), a benzodithiophene (BDT) derivative, a benzothienobenzothiophene (BTBT) derivative such as dioctylbenzothienobenzothiophene (C8-BTBT), a dinaphthothienothiophene (DNTT) derivative, a dinaphthobenzodithiophene (DNBDT) derivative, a 6,12-dioxaanthanthrene (perixanthenoxanthene) derivative, a naphthalene tetracarboxylic acid diimide (NTCDI) derivative such as N,N'-bis(cyclohexyl)naphthalene-1,4,5,8-bis(dicarboxyimide), a perylene tetracarboxylic acid diimide (PTCDI) derivative, a polythiophene derivative, a poly(2,5-bis(thiophen-2-yl)thieno[3,2-b]thiophene) (PBTTT) derivative, a tetracyanoquinodimethane (TCNQ) derivative, oligothiophenes, phthalocyanins, and fullerenes.

Further, as the organic semiconductor material, the organic semiconductor materials described in paragraphs [0063] to [0160] of JP2015-170760A, the organic semiconductor material disclosed in JP2015-195361A, and the organic semiconductor material disclosed in JP2018-006745A can be also suitably used.

On the other hand, the solvent is also not limited, and a solvent capable of dissolving an organic semiconductor material may be appropriately selected depending on the organic semiconductor material to be formed into a film.

For example, in a case where the organic semiconductor material is C8-BTBT, TIPS pentacene, TES-ADT, or the like, preferred examples of the solvent include aromatic compounds such as toluene, xylene, mesitylene, 1,2,3,4-tetrahydronaphthalene (tetralin), chlorobenzene, dichlorobenzene, and anisole.

As will be described in detail later, in the film forming method according to the embodiment of the invention, it is preferable that the concentration of the coating liquid L that is applied onto the substrate Z is high. In consideration of this point, in the preparation of the coating liquid L, it is preferable to dissolve an organic semiconductor material in a solvent while heating the solvent. That is, for increasing the saturation solubility, the coating liquid L is preferably at a higher temperature than normal temperature. In the present invention, the normal temperature is 25° C.

The temperature of the coating liquid L may be appropriately set depending on the target concentration of the coating liquid L, the organic semiconductor material to be formed into a film, the solvent to be used, and the like.

The concentration of the coating liquid L is also not limited and may be appropriately set depending on the organic semiconductor material to be used and the solvent to be used. In the present invention, the concentration of the coating liquid L is the concentration of the organic semiconductor material in the coating liquid L.

As described above, it is preferable for the concentration of the coating liquid L to be high. Specifically, 0.01% to 10% by mass is preferable, 0.05% to 5% by mass is more preferable, and 0.1% to 2% by mass is still more preferable. The reason why it is preferable for the concentration of the coating liquid L to be high will be described in detail later.

The prepared coating liquid L is supplied to the ultrasonic spray 12 via the supply pipe 14a by a supply unit 14 such as a syringe pump.

The coating liquid L is preferably supplied to the supply unit 14 while maintaining the temperature at the time of preparation or at a temperature equal to or higher than the temperature at the time of preparation. That is, in the film forming method according to the embodiment of the invention, it is preferable to supply the coating liquid L, the temperature of which has been controlled to a temperature equal to or higher than the temperature at the time of preparation, to the supply unit 14.

The amount of the coating liquid L supplied by the supply unit 14 may be appropriately set to an amount required forming a proper organic semiconductor film depending on the size of the distal end surface 20c of the ultrasonic spray 12, the target coating thickness of the coating liquid L on the substrate Z per unit time, the area of the substrate Z, that is, the film forming area of the organic semiconductor film, the target liquid droplet density in the plane direction, and the like.

In a case where the coating liquid L is prepared by heating, it is preferable to heat the coating liquid L in the supply unit 14 and the supply pipe 14a as well, as described above. The heating temperature may be appropriately set depending on the temperature of the supplied coating liquid L.

Specifically, in the supply unit 14 and the supply pipe 14a, it is preferable to heat the coating liquid L so that a temperature of the coating liquid L that is supplied to the ultrasonic spray 12 becomes within ±10° C. of a temperature of the coating liquid L that has been supplied to the supply unit 14, more preferable to heat the coating liquid L so that the temperature becomes within ±5° C. thereof, and still more preferable to heat the coating liquid L so that the temperature of the coating liquid L that has been supplied is maintained.

On the other hand, the substrate Z on which the organic semiconductor film is formed is held at a predetermined position on the substrate holder 18. Further, the temperature of the substrate Z held by the substrate holder 18 is controlled.

The temperature of the substrate Z is not limited and may be appropriately set depending on the solvent of the coating liquid L, the concentration of the coating liquid L, and the like. The temperature of the substrate Z will be described in detail later.

On the other hand, the coating liquid L supplied to the ultrasonic spray 12 is supplied to the ultrasonic spray nozzle 20 through the flow path in the main body 24. The coating liquid L supplied to the ultrasonic spray nozzle 20 is supplied to the spray part 20b through the flow path 20a and wettably spreads on the distal end surface 20c of the spray part 20b.

As described above, in a case where the coating liquid L is prepared by heating, it is preferable to heat the coating liquid L in the ultrasonic spray nozzle 20 as well. The heating temperature may be appropriately set depending on the temperature of the prepared coating liquid L.

Specifically, in the ultrasonic spray nozzle 20, it is preferable to heat the coating liquid L so that a temperature of the coating liquid L to be sprayed becomes within ±10° C. of a temperature of the coating liquid L that has been supplied to the supply unit 14, more preferable to heat the coating liquid L so that the temperature becomes within ±5° C. thereof, and still more preferable to heat the coating liquid L so that the temperature of the coating liquid L that has been supplied to the supply unit 14 is maintained.

In this state, in a case where the ultrasonic vibrator built in the main body of the ultrasonic spray 12 is vibrated, the ultrasonic spray nozzle 20 ultrasonically vibrates to spray the coating liquid that has wettably spread on the distal end surface 20c. The sprayed coating liquid L flies toward the substrate Z and is applied onto the substrate Z.

Here, in the film forming method according to the embodiment of the invention, the sprayed coating liquid L is applied onto the substrate Z while being heated by the heating unit 16, in the flight space of the coating liquid L, that is, in the flight space of the liquid droplet of the coating liquid L, from the ultrasonic spray nozzle 20 to the substrate Z.

With such a configuration, the film forming method according to the embodiment of the invention makes it possible to manufacture an organic semiconductor film having good uniformity and/or good crystallinity and high mobility with good productivity.

As described above, an organic semiconductor material has a low solubility in a solvent. As a result, it is difficult to form an organic semiconductor film having high crystallinity, high uniformity, and the like in the film formation using a coating liquid in which an organic semiconductor material is dissolved. Further, since the solubility is low, the productivity of forming an organic semiconductor film using a coating liquid is also low.

On the other hand, in the film formation of the organic semiconductor film, the crystallinity of the organic semiconductor material and the film uniformity can be improved by matching the growth speed of crystals with the drying speed of the coating liquid.

For the above improvement, it is necessary to gradually dry liquid droplets, for example, as described in the method of JP2015-185620A, in which a contact member is standed on a substrate, and liquid droplet that is in contact with the contact member and the substrate are dried from an edge part opposite to the contact member, toward the contact member.

However, in such a conventional film forming method for an organic semiconductor film, although the uniformity and the crystallinity of the film can be improved, the film forming speed is still slow, and the productivity is low. Further, it is difficult to cope with consecutive film formation such as RtoR, by a method of providing a specific member such as a contact member on the substrate.

The inventors of the present invention examined the change of film growth of an organic semiconductor material due to drying. As a result, it has been found that the consecutive supply of a coating liquid having a high concentration to crystal nuclei generated by drying accelerates the formation of the organic semiconductor film.

For the above acceleration, it is necessary to quickly increase the concentration of the liquid applied onto the substrate. However, in a case where the concentration of the coating liquid is increased by drying the coating liquid on the substrate, convection flow is generated in the coating liquid due to the latent heat of vaporization at the gas-liquid interface between the coating liquid (the liquid) and the atmosphere (the gas). In a case where the convection flow is generated in the coating liquid, crystal nuclei collide with each other due to the convection flow, and aggregates are generated. Further, concurrently with the generation of the aggregates, the aggregates adhere to the substrate. As a result, the formed organic semiconductor film becomes a non-uniform film having low crystallinity, in which aggregates are gathered.

The inventors of the present invention have carried out further examinations. As a result, it has been found that in a case where the coating liquid L in which an organic semiconductor material is dissolved is sprayed to be discharged as spherical liquid droplets in the air, and the coating liquid L during the flight is heated, the coating liquid L having a high concentration, which is not aggregated, can be consecutively added dropwise on the substrate Z.

The present invention has been made through such examinations, and in the present invention, the coating liquid L in which an organic semiconductor material is dissolved is sprayed, the coating liquid L during the flight to the substrate Z is heated, and the coating liquid L heated during the flight is applied onto the temperature-controlled substrate Z. With such a configuration, the present invention can form an organic semiconductor film having high uniformity and/or high crystallinity with high productivity.

That is, in the film forming method according to the embodiment of the invention, in a case where the coating liquid L is sprayed to be discharged as spherical liquid droplets in the air, and the coating liquid L during the flight is heated in the state of liquid droplets, the temperature of liquid droplets of the coating liquid L is raised to increase the saturation solubility inside the liquid droplets. As a result, the coating liquid L can be applied onto the substrate Z while maintaining a high concentration depending on the prepared coating liquid without causing the precipitation of crystals in the liquid droplet.

Further, depending on the degree of heating of the coating liquid L during the flight, a solvent can be evaporated, that is, removed from the liquid droplet of the coating liquid L during the flight to increase the concentration of the liquid droplet, that is, the coating liquid L. Here, in the present invention, even in a case where the solvent is removed from the liquid droplet, the high saturation solubility makes it possible to prevent the precipitation of crystals and the formation of aggregates. In addition, in the present invention, since the coating liquid L is heated in the state of liquid droplets during the flight, all the liquid droplets are uniformly heated, the concentration thereof uniformly becomes high, and the surface tension is stable over the entire region, whereby crystal nuclei are not easily generated. As a result, it is possible to prevent the formation of crystals and aggregates of the organic semiconductor material in the liquid droplet during the flight.

In a case where the coating liquid L during the flight is not heated, crystals are precipitated and aggregated in the liquid droplet during the flight due to the temperature decrease, and the obtained organic semiconductor film becomes a non-uniform film having many aggregates.

In addition, in the present invention, liquid droplets of the coating liquid L, which are heated and have a high concentration, are applied onto the temperature-controlled substrate Z. Since the liquid droplets of the coating liquid L that has adhered to the substrate Z are heated and have a high concentration, crystals are rapidly formed by evaporation of the solvent due to the landing of the liquid droplets on the substrate Z. That is, an organic semiconductor film can be formed with high productivity.

Moreover, the liquid droplets are in a high temperature state with a high saturation solubility, and further, the temperature of the substrate Z is also controlled. Accordingly, the liquid droplets that have landed on the substrate Z do not crystallize immediately after landing and can move in the plane direction of the substrate Z and be connected. As a result, in the film forming method according to the embodiment of the invention, it is possible to prevent the formation of aggregates of the organic semiconductor material in the thickness direction and to allow crystals to grow uniformly in the plane direction. As a result, an organic semiconductor film having high uniformity and/or high crystallinity can be formed.

In a case where the temperature of the substrate Z is not controlled, the liquid droplet crystallizes immediately after landing and is dried. In a case where the liquid droplets land in the place under the above situation, the crystals of the organic semiconductor material aggregate in the thickness direction. As a result, aggregates are formed in the thickness direction, and the continuity and the uniformity in the plane direction are also reduced. Further, in a case where the temperature of the substrate Z is too low with respect to the liquid temperature, crystals are precipitated in the liquid immediately after landing, and a uniform film cannot be obtained.

As described above, in the film forming method according to the embodiment of the invention, various known spray units such as an ultrasonic spray, a two-fluid spray, and an inkjet head can be used as long as they can spray a liquid. Among them, an ultrasonic spray is suitably used.

Forming a uniform organic semiconductor film, it is preferable that liquid droplets are arranged at a density that allows connection of the liquid droplets with each other on the substrate Z in the state of liquid droplets having a high concentration. The density that allows connection means a state in which a filling rate on the plane is the maximum, that is, a state of being densely filled, in a case where the liquid droplets that have landed on the substrate Z are regarded as a circle. Further, it is necessary to form at least two or more layers of liquid droplets on the substrate in order to fill the gaps of the organic semiconductor material in the plane direction in a case where the organic semiconductor film is observed from a direction orthogonal to the film surface.

In consideration of the above points, it is preferable that liquid droplets that are sprayed and land on the substrate Z have a smaller size since the gaps become smaller. However, in a case where the liquid droplets are too small, the organic semiconductor material is dried at the moment at which liquid droplets to be a first layer have landed on the substrate, and precipitated. In a case where liquid droplets to be a second or subsequent layer land in the place under the above situation, the crystals of the organic semiconductor material aggregate in the thickness direction.

In consideration of this point, the ultrasonic spray 12 is preferable since the liquid droplet size can be easily controlled and fine and appropriately sized liquid droplets can be sprayed uniformly and at a high density in the plane direction.

Further, the heating efficiency of the liquid droplet during the flight by the heating unit 16 is affected by the liquid droplet size of the coating liquid L.

In a case where the liquid droplet size is too small, there is a possibility of crystal precipitation and aggregation in the liquid droplet due to overheating. Further, in a case where the liquid droplet size is too small, there is a high possibility that crystallization occurs instantly at the time of landing on the substrate Z and aggregation occurs in the thickness direction as described above.

On the contrary, in a case where the liquid droplet size is too large, the effects of heating the liquid droplet during the flight cannot be sufficiently obtained, and there is a possibility that the crystal precipitation and aggregation may occur in the liquid droplet due to the temperature decrease. Further, in a case where the liquid droplet size is too large, it takes time to dry the liquid droplets that have landed on the substrate Z, and further, the above-described convection flow may be generated in the liquid droplet, which may cause crystal aggregation.

That is, in the present invention in which the coating liquid L is heated in the state of the liquid droplet during the flight, in a case where the liquid droplet size of the sprayed coating liquid L varies, the behaviors of the liquid droplets during the flight and the liquid droplets that have landed on the substrate Z vary, which may adversely affect the uniformity and the crystallinity of the organic semiconductor film.

In consideration of these points, it is preferable for the uniformity of the liquid droplet size to be high, and thus the ultrasonic spray 12 having the high uniformity of the size of the liquid droplets to be sprayed is preferable as a spray unit.

Further, described above, an organic semiconductor material has a low solubility in a solvent. For example, in an organic semiconductor material that is said to have high performance, the concentration of the coating liquid is about 0.1% by mass. As an example, in a case where a liquid droplet having a diameter of 10 μm has a specific gravity of 1 and a coating degree of 0.1% by mass, the film thickness of the dried film is about 10 nm.

One of advantages of the organic semiconductor film is flexibility. The flexibility of the film is affected by the film thickness. In consideration of this point, the film thickness of the organic semiconductor film is preferably about 20 to 30 nm. Further, in a case where the organic semiconductor film becomes unnecessarily thick, it is disadvantageous in terms of cost.

That is, in the film formation of organic semiconductor material, two or three drops of the liquid droplet having a diameter of about 10 μm is preferably overlayed. In a case where the liquid droplet size is too small, crystals may be precipitated immediately after landing and be aggregated in the thickness direction.

The ultrasonic spray 12 can spray liquid droplets of this size uniformly and at a high density in the plane direction with high controllability.

In addition, as described above, in the ultrasonic spray 12, the spraying region of the coating liquid L, that is, the film forming region of the coating liquid L can be suitably controlled by generating a gas flow (an assist air) in the spraying direction of the coating liquid L so that the gas flow surrounds and regulates the spraying region.

In the film forming method according to the embodiment of the invention, the temperature of the substrate Z held by the substrate holder 18 is controlled, and the coating liquid L is applied onto the substrate Z to form an organic semiconductor film.

The temperature of the substrate Z is not limited and may be appropriately set depending on the solvent of the coating liquid L, the concentration of the coating liquid L, and the like. Specifically, it is preferable to control the temperature of the substrate Z to be a temperature within ±10° C. of a temperature of the coating liquid L that has been supplied to the supply unit 14, more preferable to control the temperature of the substrate Z to be a temperature within ±5° C. thereof, and still more preferable to control the temperature of the substrate Z to be the same temperature of the coating liquid L that has been supplied to the supply unit 14.

In a case where the temperature of the substrate Z is too high, there is a possibility that crystals of the organic semiconductor material are rapidly precipitated before being arranged in the plane direction. On the contrary, in a case where the temperature of the substrate Z is too low, it becomes difficult to control the dissolution state of the organic semiconductor material in the coating liquid, on the substrate Z. On the other hand, in a case where the temperature of the substrate Z is set within ±10° C. of the temperature of the coating liquid L that has been supplied to the supply unit 14, the convection flow of the coating liquid L that has adhered to the substrate Z can be suppressed as described above, the aggregation of the organic semiconductor material in the thickness direction can be prevented, and it is possible to form an organic semiconductor film which is uniform in the plane direction and has high mobility.

In the film forming method according to the embodiment of the invention, the size of the liquid droplet of the coating liquid L to be sprayed is not limited. That is, the size of the liquid droplet of the coating liquid L may be appropriately set depending on the organic semiconductor material to be formed into a film, the concentration of the coating liquid L, the solubility of the organic semiconductor material, the dried film to be obtained, and the like.

The size of the liquid droplet of the coating liquid L is preferably 1 to 100 μm, more preferably 2 to 50 μm, and still more preferably 5 to 30 μm. The ultrasonic spray 12 can stably spray liquid droplets having a size in this range, which is also preferable at this point.

1 μm or more of the size of the liquid droplet of the coating liquid L is preferable in that it is possible to secure a drying time during which crystals of the organic semiconductor material are arranged, whereby a uniform film is easily formed, and the like. In addition, 100 μm or less of the size of the liquid droplet of the coating liquid L is preferable in that a uniform organic semiconductor film can be formed, the film forming speed can be improved, and the like.

The liquid droplet size can be measured by imaging the liquid droplet during the flight, the liquid droplet just after landing, and the like with a high-speed camera. Further, in a case where a commercially available spray unit (a nozzle) such as a commercially available ultrasonic spray nozzle 20 is used, the catalog value may be used as the liquid droplet size.

In the film forming method according to the embodiment of the invention, the liquid droplet size may be controlled by a known method depending on the spray unit.

For example, in the case of the ultrasonic spray 12 in the example illustrated in the drawing, the size of the liquid droplet to be sprayed can be controlled by controlling the frequency of the ultrasonic vibration of the ultrasonic spray nozzle 20. Basically, the higher the frequency of ultrasonic vibration, the smaller the size of the liquid droplet to be sprayed.

The distance between the distal end surface 20c of the ultrasonic spray 12 and the substrate Z, that is, the flight distance of the liquid droplet of the coating liquid L is also not limited. That is, the flight distance of the liquid droplet of the coating liquid L may be appropriately set depending on the broadness of the film forming region, the organic semiconductor material to be formed into a film, the target liquid droplet size, the concentration of the coating liquid L, and the like.

The flight distance of the liquid droplet of the coating liquid L is preferably 5 to 100 mm, more preferably 5 to 80 mm, and still more preferably 10 to 50 mm.

5 mm or more of the flight distance of the coating liquid L is preferable in that a sufficient film forming area can be secured and the heating unit 16 for heating the coating liquid L during the flight is easily installed. In addition, 100 mm or less of the flight distance of the liquid droplet is preferable in that the precipitation and the aggregation of crystals in the liquid droplet during the flight can be prevented, the liquid droplet can reliably land on the substrate Z, the influence of the accompanying air due to the difference in relative speed is small in the consecutive film formation in which the substrate Z and the ultrasonic spray 12 are relatively moved, which will be described later, and the like.

The heating temperature of the coating liquid L during the flight by the heating unit 16 is also not limited. That is, the heating temperature of the coating liquid L during the flight may be appropriately set so that the precipitation of crystals in the liquid droplet of the coating liquid L can be prevented, depending on the temperature at which the coating liquid L has been prepared, the concentration of the coating liquid L, the kind of the solvent of the coating liquid, the kind of the organic semiconductor material, and the like.

Regarding the heating by the heating unit 16, the heating is carried so that the temperature of coating liquid L in the flight space of the coating liquid L is preferably a temperature within ±10° C. of a temperature of the coating liquid L that has been supplied to the supply unit 14, more preferably a temperature within ±5° C. thereof, and still more preferably a temperature within ±3° C. thereof. The flight space of the coating liquid L is a space between the distal end surface 20c of the ultrasonic spray 12 and the substrate Z.

In a case where the coating liquid L, that is, the liquid droplets of the coating liquid L, is heated by heating the atmosphere of the flight space of the coating liquid L but not by directly heating the liquid droplets of the coating liquid L, the heating by the heating unit 16 may be carried out so that the atmosphere temperature of the flight space is within the above-described temperature range.

In a case where the heating by the heating unit 16 is carried out so that the atmosphere temperature of the coating liquid L or the flight space of the coating liquid L is within a temperature ±10° C. of a temperature of the coating liquid L that has been supplied in the supply unit 14, the precipitation of crystals and the generation of aggregates in the liquid droplet during the flight can be prevented, the concentration of the coating liquid L can suitably be increased, and the like, which are preferable.

In the film forming method according to the embodiment of the invention, after the substrate Z is coated with the coating liquid in this manner, the coating film, that is, the semi-dried organic semiconductor film is dried, as necessary.

The method for drying the organic semiconductor film is not limited, and it is possible to use various known methods that are used for drying a semi-dried coating film and drying a coating liquid with which a substrate is coated, such as heating with a heater, drying with warm air, drying with an oven, and natural drying.

The drying temperature and the drying time may be appropriately set depending on the kind of organic semiconductor material, the kind of solvent, the concentration of the coating liquid L, and the like.

The film thickness of the organic semiconductor film formed by the film forming method according to the embodiment of the invention is not limited. That is, the film thickness of the organic semiconductor film may be appropriately set to a film thickness with which the target performance can be obtained, depending on the organic semiconductor material.

As an example, the thickness of the organic semiconductor film to be formed is preferably 1 to 200 nm, more preferably 5 to 100 nm, and still more preferably 10 to 50 nm.

In the film forming method according to the embodiment of the invention, it is not necessary to provide some kind of member or the like for film formation on the substrate Z. Further, the coating liquid is applied onto the substrate Z by the ultrasonic spray 12 (the spray unit). Moreover, as described above, the coating liquid L rapidly crystallizes after being applied onto the substrate Z.

As a result, the film forming method according to the embodiment of the invention can also suitably cope with a highly productive consecutive manufacturing method in which the ultrasonic spray 12 and the substrate Z are relatively moved to form a film.

In a case where the ultrasonic spray 12 and the substrate Z are relatively moved to form a film, the ultrasonic spray 12 may be fixed and the substrate Z may be moved, the substrate Z may be fixed and the ultrasonic spray 12 may be moved, or both the ultrasonic spray 12 and the substrate Z may be moved together.

In a case where the ultrasonic spray 12 and the substrate Z are relatively moved to form a film, a flow of airflow generated in association with the relative movement, so-called accompanying air, is generated. In the present invention, in a case where the ultrasonic spray 12 and the substrate Z are relatively moved to form a film, the relative moving speed at which the accompanying air does not adversely affect the sprayed coating liquid L may be appropriately set.

In a case where an organic semiconductor film is formed while the substrate Z and the ultrasonic spray 12 are relatively moved, a plurality of ultrasonic sprays 12 may be arranged in a direction orthogonal to the moving direction to form the organic semiconductor film. In this case, the number of substrates Z on which a film is formed by the plurality of ultrasonic sprays 12 may be one, or a plurality of substrates Z arranged in the direction orthogonal to the moving direction may be simultaneously subjected to film formation.

Further, in a case where a plurality of ultrasonic sprays 12 are used, the heating of the coating liquid L during the flight, sprayed by the ultrasonic spray 12, may be carried out for an individual ultrasonic spray 12 or the plurality of ultrasonic sprays by one heating unit 16.

The above points are the same in the film formation by RtoR described later.

In a case where the substrate Z is a long sheet-shaped substrate, roll-to-roll (RtoR) can also be used. As is well known, RtoR is a manufacturing method in which a substrate is sent out from a roll around which the substrate Z is wound, the formation of the organic semiconductor film is carried out while transporting the substrate Z in the longitudinal direction, and the substrate Z on which the film has been formed is wound in a roll shape.

In a case where RtoR is used for the film forming method according to the embodiment of the invention, the organic semiconductor film to be formed may be a film uniform in the plane direction, a so-called solid film, or a film patterned regularly or irregularly.

The film forming method for an organic semiconductor film according to the embodiment of the invention has been described in detail above; however, the present invention is not limited to the above aspects, and various improvements and modifications may be carried out without departing from the gist of the present invention.

EXAMPLES

Hereinafter, the present invention will be described specifically with reference to Examples. The present invention is not limited to the specific examples described below.
[Preparation of Substrate]
<Base Material>
As a base material of a substrate, a PEN film (Teonex Q65, manufactured by TEIJIN LIMITED) having a thickness of 100 µm and having no undercoat layer was prepared.
<Formation of Gate Electrode>
A mask was placed on the surface of the base material, and a gold thin film having a thickness of 50 nm was formed as a gate electrode by sputtering that targeted gold.
<Gate Insulating Film>
A silicon oxide film having a thickness of 1,000 nm was formed as a gate insulating film so that the entire surface of the base material was covered by sputtering that targeted silicon oxide ($SiO_2$).
<Formation of SAM Film>
For the control of the contact angle of the gate insulating film, a trimethoxy(2-phenylethyl)silane film was formed as a SAM film on the surface of the gate insulating film.

1 milliliter (mL) of trimethoxy(2-phenylethyl)silane (manufactured by Tokyo Chemical Industry Co., Ltd.) was added in a 3 mL vial bottle. Next, this vial bottle and the substrate on which the gate insulating layer had been formed were placed in an oven at 130° C. and heated for 3 hours. In this manner, trimethoxy(2-phenylethyl)silane in the vial bottle is evaporated, and a SAM film formed of trimethoxy (2-phenylethyl)silane is formed on the gate insulating film.

For removing the excess SAM film, toluene was added in an ultrasonic cleaning device, and the substrate on which the SAM film had been formed was immersed therein and washed for 5 minutes. Further, isopropyl alcohol was added to another ultrasonic cleaning device, and the substrate on which the SAM film had been formed was washed and rinsed for 5 minutes.

The substrate on which the SAM film had been formed was dried with a dryer for about 3 minutes to remove the rinsing liquid. It was confirmed by using a contact angle meter that the contact angle of the substrate formed up to the SAM film thereon was 70°.

A work-in-process product matching with a bottom-gate and top-contact type organic thin film transistor having a gate electrode, a gate insulating film, and a SAM film formed on the surface of the base material thus produced was used as a substrate.
[Configuration of Film Forming Device]
As an ultrasonic spray nozzle, an AccuMist Nozzle manufactured by Sono-Tek Corporation was prepared. A commercially available ultrasonic vibrator was engaged with this ultrasonic spray nozzle so that the ultrasonic spray nozzle could be ultrasonically vibrated, whereby an ultrasonic spray was obtained.

A 10 mL syringe pump was connected to the ultrasonic spray nozzle via a silicone tube. A ribbon heater was wound around the silicon tube and the syringe pump to maintain the temperature of the supplied coating liquid by temperature control using a thermocouple.

The ultrasonic spray was fixed so that the coating liquid was sprayed in the vertical direction. A small amount of air was supplied from the outer edge of the distal end surface of the ultrasonic spray nozzle so that the coating liquid (the liquid droplet of the coating liquid) sprayed by the ultrasonic spray nozzle was not scattered, and the flow of the coating liquid was regulated to be uniform. As the air, dry air at 25° C. that had passed through the heating pipe was used.

On the other hand, the substrate placed on the hot plate was disposed directly below the spraying direction of the coating liquid. The hot plate was placed on an X stage manufactured by CHUO PRECISION INDUSTRIAL Co., Ltd. so that it could move relatively with respect to the fixed ultrasonic spray at any speed.

Figure 3:
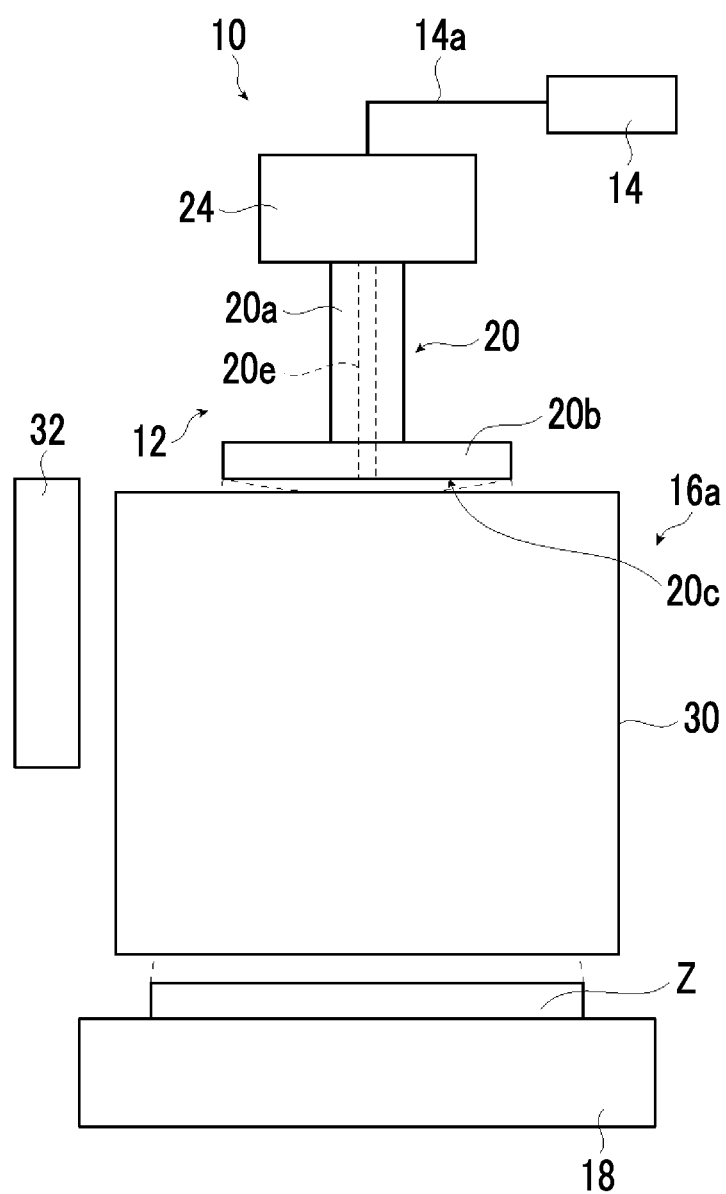
FIG. 3 is a diagram conceptually illustrating another example of a film forming device for carrying out a film forming method for an organic semiconductor film according to the embodiment of the invention.
Figure 4:
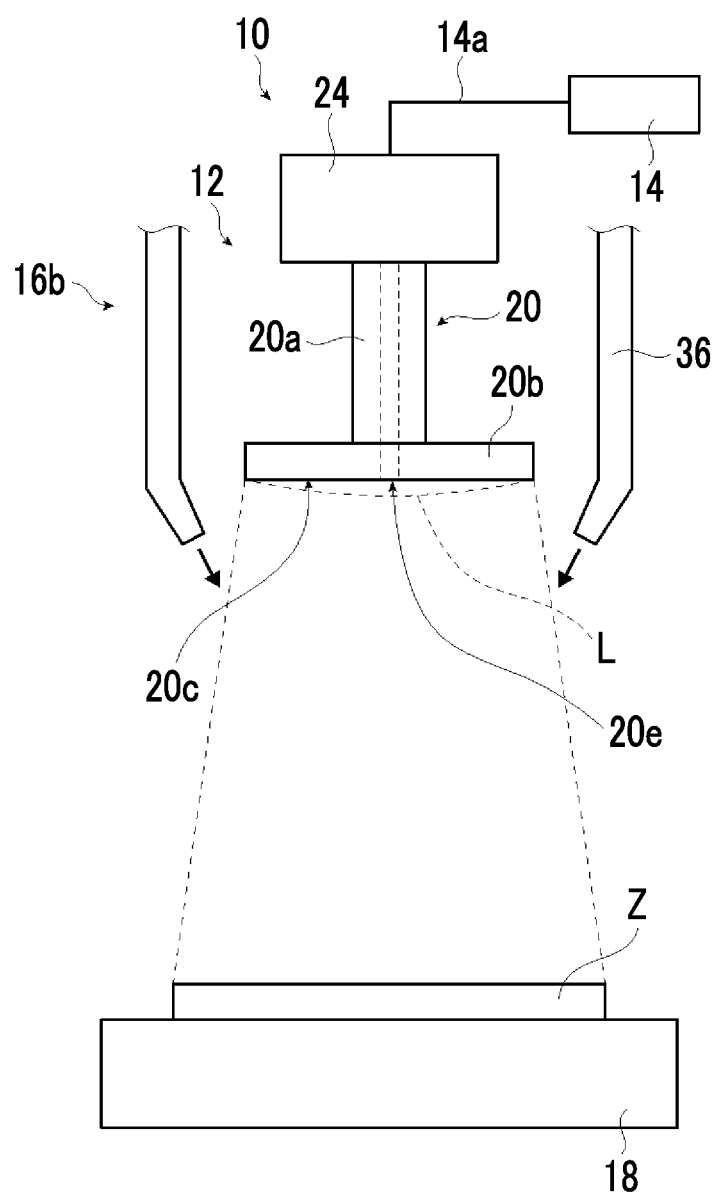
FIG. 4 is a diagram conceptually illustrating another example of a film forming device for carrying out a film forming method for an organic semiconductor film according to the embodiment of the invention.

A stainless steel cylinder having a diameter of 30 mm was arranged to surround the flight space of the coating liquid sprayed by the ultrasonic spray, from the distal end surface of the ultrasonic spray nozzle to the surface of the substrate (see FIG. 3). The height of the cylinder was set to be a height of 80% of the distance from the distal end surface of the ultrasonic spray nozzle to the surface of the substrate.

In addition, an infrared heater (HYS-45W-A, manufactured by HYBEC Corporation) was provided so that the cylinder could be heated. This made it possible to control the atmosphere temperature in the inside the cylinder, that is, in the flight space of the coating liquid sprayed by the ultrasonic spray.

Example 1

<Preparation of Coating Liquid>

An organic semiconductor material (C8-BTBT, manufactured by Sigma-Aldrich Co., LLC) was dissolved in toluene to prepare a coating liquid having a concentration of 1% by mass. The temperature of the coating liquid was 60° C.

<Formation of Organic Semiconductor Film>

Using such a coating liquid and the film forming device described above, the coating liquid was applied onto the surface of the SAM film on the gate insulating film of the substrate to form a coating film having a width of 10 mm and a length of 100 mm. The coating film is a semi-dried organic semiconductor film in which a small amount of solvent remains.

The substrate was linearly moved at a speed of 10 mm/sec in a path including the space directly below the ultrasonic spray nozzle. The temperature of the substrate was controlled to 60° C. by a hot plate.

The amount of the coating liquid supplied from the syringe pump to the ultrasonic spray nozzle was 0.5 mL/min. The syringe pump and the silicone tube were heated with a ribbon heater to maintain the temperature of the supplied coating liquid.

The ultrasonic spray nozzle was ultrasonically vibrated at a frequency of 120 kHz by an ultrasonic vibrator. The diameter of the sprayed liquid droplet is about 13 μm. The diameter of the sprayed liquid droplet was known from the catalog of AccuMist Nozzle.

The distance from the distal end surface of the ultrasonic spray nozzle to the surface of the substrate, that is, the flight distance of the liquid droplet of the coating liquid sprayed by the ultrasonic spray was set to 40 mm.

The output of the infrared heater that heated the cylinder was controlled so that the temperature in the inside the cylinder, that is, the atmosphere temperature of the flight space of the coating liquid was 60° C.

After forming the coating film, the substrate was heated in an oven at 130° C. for 10 minutes to remove the residual solvent, whereby an organic semiconductor film (a C8-BTBT film) was formed.

Example 2

An organic semiconductor film was formed on a surface of a substrate in the same manner as in Example 1 except that the atmosphere temperature of the flight space of the coating liquid was set to 50° C.

Example 3

An organic semiconductor film was formed on a surface of a substrate in the same manner as in Example 1 except that the atmosphere temperature of the flight space of the coating liquid was set to 70° C.

Example 4

An organic semiconductor film was formed on a surface of a substrate in the same manner as in Example 1 except that the coating liquid was heated to 100° C. and supplied to the syringe pump and the atmosphere temperature of the flight space of the coating liquid was set to 100° C.

Example 5

An organic semiconductor film was formed on a surface of a substrate in the same manner as in Example 1 except that the coating liquid was heated to 100° C. and supplied to the syringe pump.

Example 6

An organic semiconductor film was formed on a surface of a substrate in the same manner as in Example 1 except that the coating liquid was heated to 100° C. and supplied to the syringe pump and the atmosphere temperature of the flight space of the coating liquid was set to 120° C.

Example 7

An organic semiconductor film was formed on a surface of a substrate in the same manner as in Example 1 except that the frequency of ultrasonic vibration of the ultrasonic spray nozzle was set to 25 kHz. The diameter of the sprayed liquid droplet is about 40 μm.

Example 8

An organic semiconductor film was formed on a surface of a substrate in the same manner as in Example 1 except that the frequency of ultrasonic vibration of the ultrasonic spray nozzle was set to 180 kHz. The diameter of the sprayed liquid droplet is about 10 μm.

Example 9

An organic semiconductor film was formed on a surface of a substrate in the same manner as in Example 1 except that the distance from the distal end surface of the ultrasonic spray nozzle to the surface of the substrate, that is, the flight distance of the coating liquid was set to 100 mm.

Example 10

An organic semiconductor film was formed on a surface of a substrate in the same manner as in Example 1 except that the distance from the distal end surface of the ultrasonic spray nozzle to the surface of the substrate, that is, the flight distance of the coating liquid was set to 10 mm.

Example 11

An organic semiconductor film was formed on a surface of a substrate in the same manner as in Example 1 except that the coating liquid was prepared at 25° C., the concentration thereof was set to 0.5% by mass, the coating liquid was heated to 40° C. to supply the syringe pump, and the temperature of the substrate was set to 40° C.

Example 12

An organic semiconductor film was formed on a surface of a substrate in the same manner as in Example 1 except that the coating liquid was prepared at 40° C., the concentration thereof was set to 0.1% by mass, the atmosphere temperature of the flight space of the coating liquid was set to 25° C., and the temperature of the substrate was set to 40° C.

Example 13

An organic semiconductor film was formed on a surface of a substrate in the same manner as in Example 1 except that the coating liquid was prepared at 40° C., the concentration thereof was set to 0.1% by mass, the atmosphere temperature of the flight space of the coating liquid was set to 40° C., and the temperature of the substrate was set to 40° C.

Example 14

An organic semiconductor film was formed on a surface of a substrate in the same manner as in Example 1 except that the coating liquid was prepared at 90° C., the concentration thereof was set to 2% by mass, and the temperature of the substrate was set to 90° C.

Example 15

An organic semiconductor film was formed on a surface of a substrate in the same manner as in Example 1 except that the coating liquid was prepared at 90° C., the concentration thereof was set to 2% by mass, the atmosphere temperature of the flight space of the coating liquid was set to 90° C., and the temperature of the substrate was set to 90° C.

Example 16

An organic semiconductor film was formed on a surface of a substrate in the same manner as in Example 1 except that the coating liquid was prepared at 90° C., the concentration thereof was set to 2% by mass, the atmosphere temperature of the flight space of the coating liquid was set to 110° C., and the temperature of the substrate was set to 90° C.

Example 17

An organic semiconductor film was formed on a surface of a substrate in the same manner as in Example 1 except that the temperature of the substrate was set to 70° C.

Example 18

An organic semiconductor film was formed on a surface of a substrate in the same manner as in Example 1 except that the temperature of the substrate was set to 50° C.

Example 19

An organic semiconductor film was formed on a surface of a substrate in the same manner as in Example 1 except that the spray unit was changed to a two-fluid spray (Airbrush HP-CPus, manufactured by ANEST IWATA Corporation) to spray the coating liquid.

Regarding the spraying of the coating liquid, the sprayed liquid droplets were observed with a high-speed camera to control the gas (air) amount so that the diameter of the liquid droplet was about 20 μm.

Example 20

An organic semiconductor film was formed on a surface of a substrate in the same manner as in Example 1 except that the spray unit was changed to a rotary spray nozzle (an RA-20 rotary atomizer, manufactured by Nordson Corporation) to spray the coating liquid.

Regarding the spraying of the coating liquid, the sprayed liquid droplets were observed with a high-speed camera to control the gas (air) amount and rotation speed so that the diameter of the liquid droplet was about 20 μm.

Comparative Example 1

An organic semiconductor film was formed on a surface of a substrate in the same manner as in Example 1 except that the heating of the flight space of the coating liquid was not carried out.

The atmosphere temperature of the flight space of the coating liquid was about 20° C. due to the volatilization of the solvent in the flight space.

Comparative Example 2

An organic semiconductor film was formed on a surface of a substrate in the same manner as in Example 1 except that the temperature of the substrate was not controlled.

As a result of measuring the temperature of the substrate during the film formation of the organic semiconductor film from the back surface with a thermocouple, the temperature was 15° C.

[Evaluation]
<Film Uniformity>

The formed organic semiconductor film was observed under a differential interference microscope to observe the film uniformity and the formation of aggregates. Five regions of fields of view of a 1 mm×1 mm square under the microscope were randomly selected and evaluated as follows, A: a state in which the film is formed as a single uniform crystalline film,
B: a state in which more than half of the film area has a uniform continuous film,
C: a state in which a part of the film is a uniform film,
D: a state in which that film is connected intermittently, or
E: a state in which aggregates are seen sparsely.

<Measurement of Mobility>

Copper was vacuum-deposited on the formed organic semiconductor film to form a source electrode and a drain electrode, whereby an organic thin film transistor was prepared.

Each of the source electrode and the drain electrode had a channel length of 50 μm, a thickness of 30 nm, and a channel width of 1 mm.

The carrier mobility of the manufactured organic thin film transistor was measured by the following method.

A voltage of −40 V was applied between the source electrode and the drain electrode, the gate voltage was changed in a range of 40 V to −40 V, and the carrier mobility μ was calculated using the following expression representing the drain current Id.

$$Id=(w/2L)\mu Ci(Vg-Vth)^2$$

(In the expression, L is the gate length, w is the gate width, Ci is the capacitance per unit area of the insulating layer, Vg is the gate voltage, and Vth is the threshold voltage.)

The evaluation results are shown in the table below.

For obtaining the thickness of the organic semiconductor film, the height difference at the end part of the organic semiconductor film was measured under an atomic force microscope, and the height of this height difference was taken as the film thickness.

temperature of the coating liquid, it is possible to more suitably form an organic semiconductor film having good uniformity and/or crystallinity, and having high mobility.

As shown in Examples 4 to 6, in a case where the substrate temperature becomes close to the temperature of the flight space, it is possible to more suitably form an organic semiconductor film having good uniformity and/or good crystallinity, and having high mobility.

As shown in Example 7 and Example 8, in a case where the size of the liquid droplet of the coating liquid is set to 3 to 30 μm, it is possible to more suitably form an organic semiconductor film having good uniformity and/or good crystallinity, and having high mobility.

TABLE 1

|  | Coating liquid | | Substrate | Spray coating liquid | | | Atmosphere | | Evaluation | |
| --- | --- | --- | --- | --- | --- | --- | --- | --- | --- | --- |
|  | Concentration [% by mass] | Temperature [° C.] | temperature [° C.] | Spray method | Diameter [μm] | Flight distance [mm] | temperature of flight space [° C.] | Film thickness [nm] | Uniformity | Mobility |
| Example 1 | 1 | 60 | 60 | Ultrasonic | 13 | 40 | 60 | 100 | A | 3.1 |
| Example 2 | 1 | 60 | 60 | Ultrasonic | 13 | 40 | 50 | 100 | B | 1.9 |
| Example 3 | 1 | 60 | 60 | Ultrasonic | 13 | 40 | 70 | 100 | B | 1.8 |
| Example 4 | 1 | 100 | 60 | Ultrasonic | 13 | 40 | 100 | 100 | B | 1.9 |
| Example 5 | 1 | 100 | 60 | Ultrasonic | 13 | 40 | 60 | 100 | A | 3.4 |
| Example 6 | 1 | 100 | 60 | Ultrasonic | 13 | 40 | 120 | 100 | C | 1.2 |
| Example 7 | 1 | 60 | 60 | Ultrasonic | 40 | 40 | 60 | 250 | C | 1.1 |
| Example 8 | 1 | 60 | 60 | Ultrasonic | 10 | 40 | 60 | 60 | A | 3.1 |
| Example 9 | 1 | 60 | 60 | Ultrasonic | 13 | 100 | 60 | 100 | D | 0.5 |
| Example 10 | 1 | 60 | 60 | Ultrasonic | 13 | 10 | 60 | 100 | B | 2.0 |
| Example 11 | 0.5 | 40 | 40 | Ultrasonic | 13 | 40 | 40 | 50 | B | 1.7 |
| Example 12 | 0.1 | 40 | 40 | Ultrasonic | 13 | 40 | 50 | 10 | D | 0.6 |
| Example 13 | 0.1 | 40 | 40 | Ultrasonic | 13 | 40 | 30 | 10 | C | 1.0 |
| Example 14 | 2 | 90 | 90 | Ultrasonic | 13 | 40 | 60 | 200 | C | 1.1 |
| Example 15 | 2 | 90 | 90 | Ultrasonic | 13 | 40 | 90 | 200 | A | 2.9 |
| Example 16 | 2 | 90 | 90 | Ultrasonic | 13 | 40 | 110 | 200 | B | 2.1 |
| Example 17 | 1 | 60 | 70 | Ultrasonic | 13 | 40 | 60 | 100 | B | 2.1 |
| Example 18 | 1 | 60 | 50 | Ultrasonic | 13 | 40 | 60 | 100 | B | 2.1 |
| Example 19 | 1 | 60 | 60 | Two-fluid | 20 | 40 | 60 | 150 | C | 1.1 |
| Example 20 | 1 | 60 | 60 | Rotary | 20 | 40 | 60 | 150 | C | 1.2 |
| Comparative Example 1 | 1 | 60 | 25 | Ultrasonic | 13 | 40 | 20 | 100 | E | 0.01 |
| Comparative Example 2 | 1 | 60 | 15 | Ultrasonic | 13 | 40 | 60 | 100 | E | 0.01 |

In this table, the coating liquid temperature is a coating liquid temperature supplied to the syringe pump. In Examples 4 to 6 and Example 11, coating liquids are heated to the respective temperatures in the table, after being prepared. In Comparative Example 1, the heating of the flight space of the liquid droplet is not carried out. In Comparative Example 2, the temperature control of the substrate is not carried out.

As shown in the table above, according to the film forming method according to the embodiment of the invention, in which the temperature of the substrate is controlled while the sprayed coating liquid is heated during the flight, it is possible to suppress the precipitation of aggregates into the organic semiconductor film, and thus an organic semiconductor film having good uniformity and/or good crystallinity and having high mobility can be formed. On the other hand, in Comparative Example 1 in which the coating liquid was not heated during the flight and Comparative Example 2 in which the temperature of the substrate was not controlled, crystals were precipitated during the flight of the coating liquid and at the moment of landing on the substrate, and thus aggregates were generated.

Furthermore, as shown in Examples 1 to 18, in a case where an ultrasonic spray is used, it is possible to form an organic semiconductor film that is stable, has good uniformity and/or good crystallinity, and has high mobility.

Further, as shown in Example 1, Example 2, and Example 3, in a case where the temperature of the flight space of the coating liquid is set to a temperature within ±10° C. of the As shown in Example 9 and Example 10, in a case where the flight distance of the coating liquid is set to 5 to 80 mm, it is possible to more suitably form an organic semiconductor film having good uniformity and/or good crystallinity, and having high mobility.

As shown in Examples 11 to 16, in a case where the concentration of the coating liquid is increased, it is possible to easily form an organic semiconductor film having good uniformity and/or good crystallinity, and having high mobility. In addition, as shown in Example 11 and Examples 14 to 16, in a case where the temperature difference between the coating liquid temperature, the substrate temperature, and the temperature of the flight space of the coating liquid is reduced, it is possible to more suitably form an organic semiconductor film having good uniformity and/or good crystallinity, and having high mobility.

Further, as shown in Example 1, Example 17, and Example 18, in a case where the temperature difference between the coating liquid temperature, the substrate temperature, and the temperature of the flight space of the coating liquid is reduced, it is possible to more suitably form an organic semiconductor film having good uniformity and/or good crystallinity, and having high mobility.

From the above results, the effects of the present invention are clear.

EXPLANATION OF REFERENCES

10: film forming device
12: ultrasonic spray
14: supply unit
16, 16a, 16b: heating unit
18: substrate holder
20, 20A: ultrasonic spray nozzle
20a: flow path
20b: spray part
20c: distal end surface
20d: protruding part
20e: hole part
24: main body
30: heating cylinder
32: temperature control unit
36: supply pipe
Z: substrate

What is claimed is:

1. A film forming method for an organic semiconductor film, comprising:
   dissolving an organic semiconductor material in a solvent to prepare a coating liquid;
   spraying the coating liquid with a spray unit; and
   coating a temperature-controlled substrate with the coating liquid while heating the coating liquid during flight, which has been sprayed with the spray unit,
   wherein the spray unit is an ultrasonic spray.

2. The film forming method for an organic semiconductor film according to claim 1,
   wherein a surface roughness Ra of a distal end surface of a nozzle of the ultrasonic spray is 1 to 100 μm.

3. The film forming method for an organic semiconductor film according to claim 1,
   wherein the ultrasonic spray has a tapered protruding part on a peripheral part of a distal end surface of a nozzle.

4. The film forming method for an organic semiconductor film according to claim 1,
   wherein the coating liquid is prepared by heating.

5. The film forming method for an organic semiconductor film according to claim 1,
   wherein the heated coating liquid is supplied to the spray unit.

6. The film forming method for an organic semiconductor film according to claim 1,
   wherein the coating liquid is heated in a supply unit for supplying the coating liquid to the spray unit.

7. The film forming method for an organic semiconductor film according to claim 1,
   wherein spraying is carried out while the coating liquid is heated in the spray unit.

8. The film forming method for an organic semiconductor film according to claim 1,
   wherein the coating liquid during flight is heated with an infrared heater.

9. The film forming method for an organic semiconductor film according to claim 1,
   wherein the coating liquid during flight is heated with a temperature-controlled cylinder that surrounds at least a part of a flight space of the coating liquid.

10. The film forming method for an organic semiconductor film according to claim 1,
    wherein the coating liquid during flight is heated with a temperature-controlled gas that flows on an outer side of a flight space of the coating liquid in a flight direction of the coating liquid.

11. The film forming method for an organic semiconductor film according to claim 1,
    wherein the substrate is coated with the coating liquid while a flight space of the coating liquid is regulated with a gas that flows in a flight direction of the coating liquid.

12. The film forming method for an organic semiconductor film according to claim 1,
    wherein a temperature of the substrate is controlled within ±10° C. of a temperature of the coating liquid that is supplied to a supply unit for supplying the coating liquid to the spray unit.

* * * * *